United States Patent
Watanabe

(10) Patent No.: US 9,090,062 B2
(45) Date of Patent: Jul. 28, 2015

(54) CIRCUIT BOARD AND METHOD OF MANUFACTURING INKJET HEAD

(75) Inventor: Toshimitsu Watanabe, Yokohama (JP)

(73) Assignee: Toshiba Tec Kabushiki Kaisha, Tokyo (JP)

( * ) Notice: Subject to any disclaimer, the term of this patent is extended or adjusted under 35 U.S.C. 154(b) by 394 days.

(21) Appl. No.: 13/420,803

(22) Filed: Mar. 15, 2012

(65) Prior Publication Data
US 2012/0289065 A1   Nov. 15, 2012

(30) Foreign Application Priority Data

May 12, 2011   (JP) ................................. 2011-107499

(51) Int. Cl.
H05K 1/00       (2006.01)
H05K 1/18       (2006.01)
H05K 7/00       (2006.01)
B41J 2/14       (2006.01)
H05K 1/02       (2006.01)
H05K 3/00       (2006.01)
H05K 3/34       (2006.01)
H05K 3/36       (2006.01)

(52) U.S. Cl.
CPC .............. B41J 2/14201 (2013.01); H05K 1/02 (2013.01); H05K 3/00 (2013.01); B41J 2002/14362 (2013.01); H05K 3/3405 (2013.01); H05K 3/363 (2013.01); H05K 2201/09145 (2013.01); H05K 2201/10189 (2013.01); H05K 2201/10356 (2013.01); H05K 2203/0165 (2013.01); Y10T 29/49124 (2015.01)

(58) Field of Classification Search
CPC ... H05K 3/284; H05K 3/3447; H05K 3/3452; H05K 1/141; H01L 2224/48091
See application file for complete search history.

(56) References Cited

U.S. PATENT DOCUMENTS 5,831,656 A *  11/1998  Chosa ........................... 347/108
7,384,132 B2 *  6/2008  Ito .................................... 347/68
7,674,984 B2 *  3/2010  Kubo ............................. 174/254

(Continued)

FOREIGN PATENT DOCUMENTS

CN     101682987      3/2010
JP     06-283872      10/1994

(Continued)

OTHER PUBLICATIONS

Japanese Office Action for Japanese Application No. 2011-107499 mailed on Jul. 23, 2013.

(Continued)

Primary Examiner — Hoa C Nguyen
Assistant Examiner — Xanthia C Cunningham
(74) Attorney, Agent, or Firm — Amin, Turocy & Watson, LLP

(57) ABSTRACT

According to one embodiment, a circuit board includes a board main body, an electrode, a circuit plate and a connector. The board main body includes a first surface, a second surface located opposite to the first surface, a first side edge that extends between the first surface and the second surface, and a second side edge that extends between the first surface and the second surface and intersects the first side edge. The second side edge is provided with a fitting part. The electrode is provided on the first surface. The circuit plate is soldered to the electrode and has flexibility. The connector is attached to the board main body. A cable is inserted into the connector in a direction perpendicular to the first side edge.

4 Claims, 9 Drawing Sheets

(56) References Cited

U.S. PATENT DOCUMENTS

| | | | |
|---|---|---|---|
| 2005/0168955 A1* | 8/2005 | Karasawa et al. | 361/730 |
| 2007/0017694 A1* | 1/2007 | Kubo | 174/250 |
| 2007/0258181 A1* | 11/2007 | Eguchi et al. | 361/178 |
| 2008/0084674 A1* | 4/2008 | Silverbrook et al. | 361/739 |
| 2008/0104832 A1* | 5/2008 | Shintate | 29/846 |
| 2008/0218558 A1* | 9/2008 | Yamashita | 347/68 |
| 2008/0230268 A1* | 9/2008 | Kubo | 174/70 R |
| 2009/0308646 A1* | 12/2009 | Toyoda | 174/257 |
| 2011/0122587 A1* | 5/2011 | Deming et al. | 361/749 |
| 2011/0304673 A1* | 12/2011 | Ciminelli et al. | 347/50 |

FOREIGN PATENT DOCUMENTS

| | | |
|---|---|---|
| JP | 2000-218774 | 8/2000 |
| JP | 2002-321371 | 11/2002 |
| JP | 2008-230014 | 10/2008 |

OTHER PUBLICATIONS

Chinese Office Action for Chinese Patent Application No. 201210036875.8 mailed on Mar. 5, 2014.

* cited by examiner

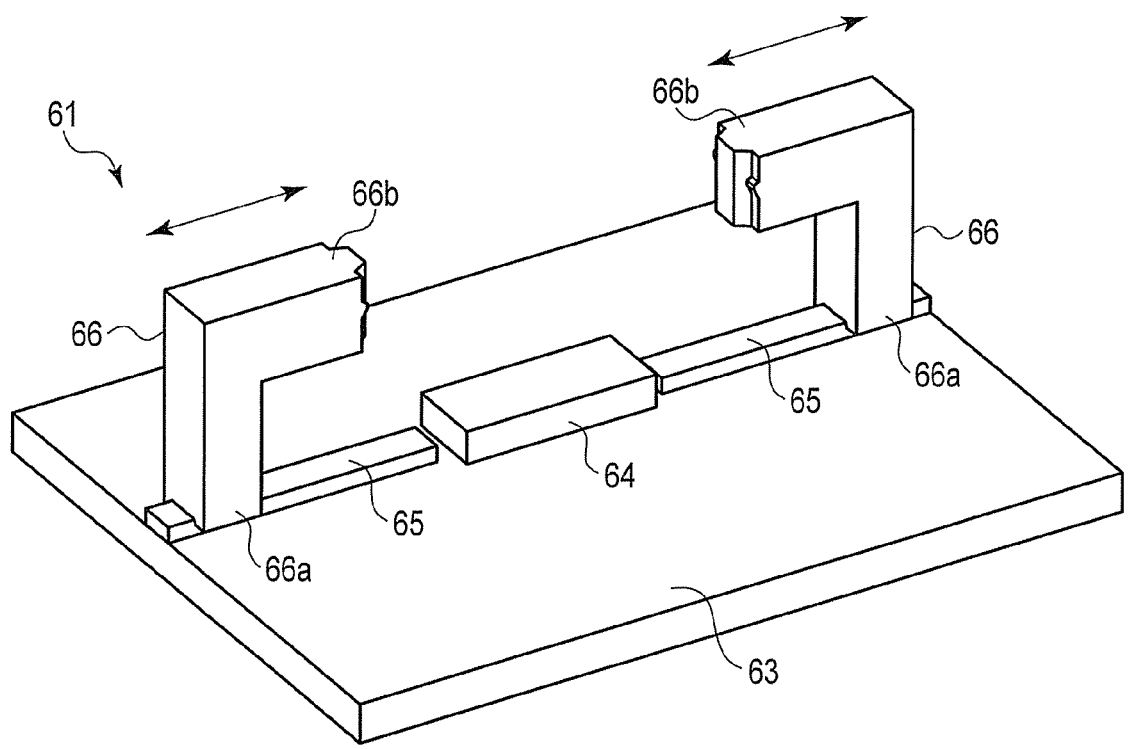
F I G. 4

CIRCUIT BOARD AND METHOD OF MANUFACTURING INKJET HEAD

CROSS-REFERENCE TO RELATED APPLICATIONS

This application is based upon and claims the benefit of priority from the prior Japanese Patent Application No. 2011-107499, filed on May 12, 2011, the entire contents of which are incorporated herein by reference.

FIELD

Embodiments described herein relate generally to a circuit board and a method of manufacturing an inkjet head.

BACKGROUND

Electronic devices such as an inkjet head include a circuit board. Conductive traces are formed on the circuit board, and mounted parts such as an IC and a connector are attached to the circuit board. Generally, a circuit board is fixed to a housing or another component by, for example, screws. In this case, when a cable is connected to or disconnected from a connector mounted on the circuit board, a load on the mounted parts is slight.

On the other hand, a circuit board is not fixed in some electronic apparatuses. When a cable is inserted into a connector of such a circuit board, the worker performs work in a state of holding the circuit board by hand.

When the worker holds the circuit board by hand, the circuit board may move slightly. Due to such a movement of the circuit board, a soldered part of a component which is connected to the circuit board may be damaged.

BRIEF DESCRIPTION OF THE DRAWINGS

FIG. 4 is a perspective view of an assembling jig according to the embodiment;

DETAILED DESCRIPTION

In general, according to one embodiment, a circuit board includes a board main body, an electrode, a circuit plate and a connector. The board main body includes a first surface, a second surface located opposite to the first surface, a first side edge that extends between the first surface and the second surface, and a second side edge that extends between the first surface and the second surface and intersects the first side edge. The second side edge is provided with a fitting part. The electrode is provided on the first surface. The circuit plate is soldered to the electrode and has flexibility. The connector is attached to the board main body. A cable is inserted into the connector in a direction perpendicular to the first side edge.

Figure 1:
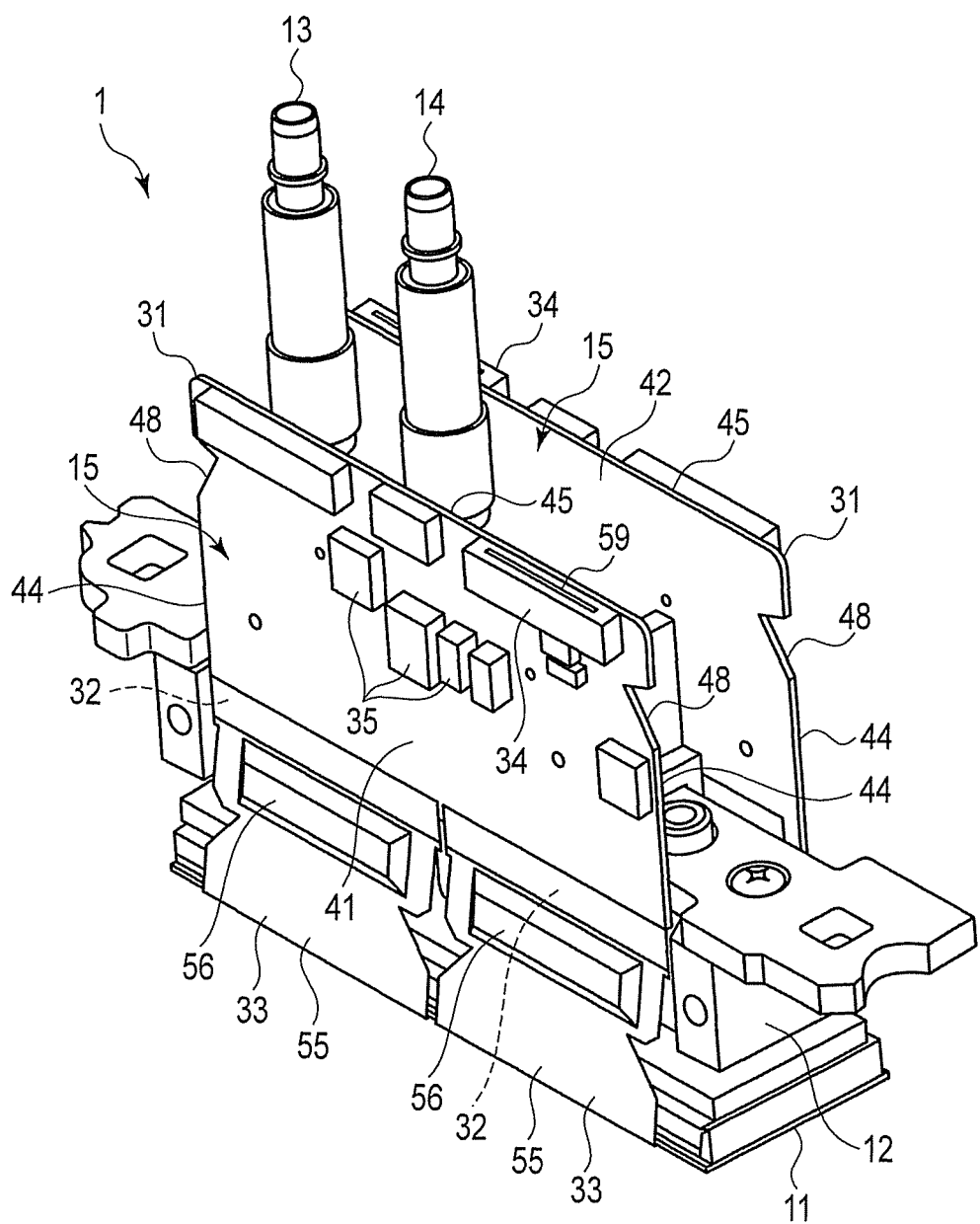
FIG. 1 is a perspective view of an inkjet head according to an embodiment.
Figure 2:
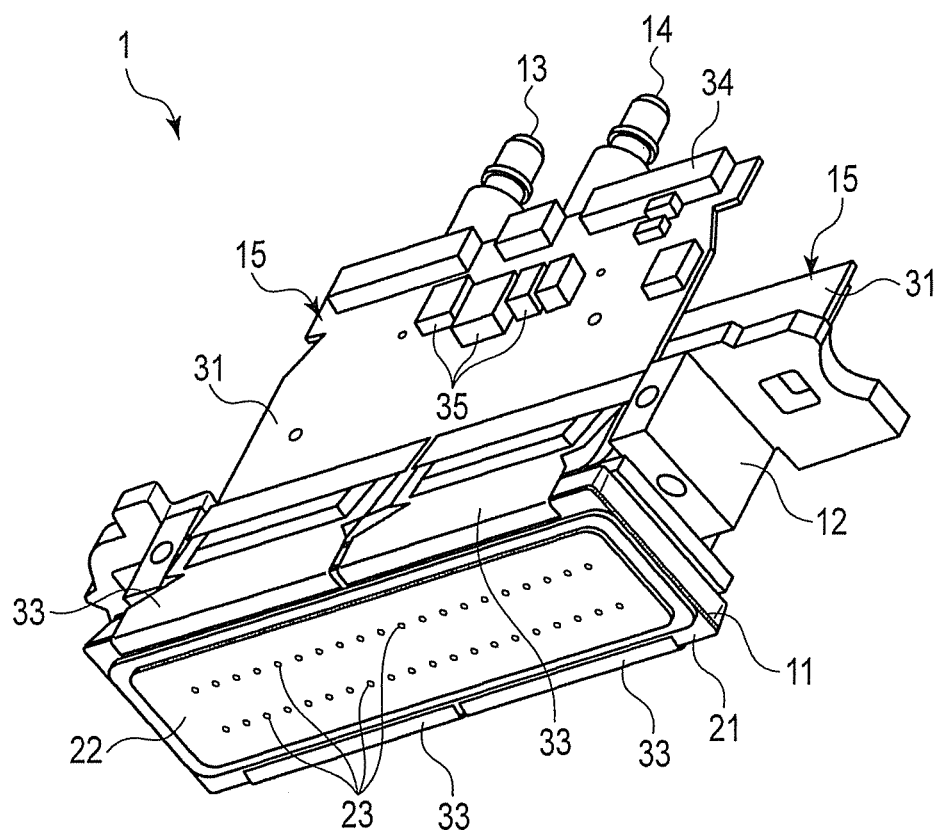
FIG. 2 is another perspective view of the inkjet head of the embodiment, as viewed from another direction.

An embodiment will be explained hereinafter with reference to FIG. 1 to FIG. 10. FIG. 1 is a perspective view of an inkjet head 1. FIG. 2 is another perspective view of the inkjet head 1, as viewed from another direction.

As illustrated in FIG. 1, the inkjet head 1 is an inkjet head of a so-called side-shooter type. The inkjet head 1 comprises a head main body 11, a manifold 12, a supply pipe 13, a discharge pipe 14, and a pair of circuit boards 15. In FIG. 1, the manifold 12 is illustrated with various parts such as part to attach the inkjet head 1 into an inkjet printer.

The head main body 11 is a device configured to eject ink. As illustrated in FIG. 2, the head main body 11 includes a base plate 21, and a nozzle plate 22. An ink chamber which is supplied with ink is formed inside the head main body 11.

The base plate 21 is formed of ceramic such as alumina, and has a rectangular plate shape. A piezoelectric element is attached to the base plate 21. The piezoelectric element is formed of, for example, lead zirconate titanate (PZT). The piezoelectric element is disposed in the ink chamber, and provided with a plurality of grooves. Electrodes are formed in the respective grooves. The electrodes are connected to electrical traces formed on the base plate 21. When a voltage is applied to the electrodes, the piezoelectric element is deformed, and pressurizes ink in the grooves.

The nozzle plate 22 is formed of a rectangular film of, for example, polyimide. The nozzle plate 22 is attached to the base plate 21 with a frame-shaped member interposed therebetween. The ink chamber is enclosed by the base plate 21, the nozzle plate 22, and the frame-shaped member. The nozzle plate 22 is provided with a plurality of nozzle holes 23 which correspond to the respective grooves of the piezoelectric element. Ink which is pressurized in the grooves is ejected from the corresponding nozzle holes 23.

The head main body 11 is attached to the manifold 12. A plurality of channels are formed inside the manifold 12. Each of the channels communicates with the ink chamber of the head main body 11.

The supply pipe 13 and the discharge pipe 14 are connected to an ink tank which stores ink. The supply pipe 13 and the discharge pipe 14 are connected to the channels of the manifold 12. Ink in the ink tank is supplied to the ink chamber through the supply pipe 13 and the manifold 12. Ink in the ink chamber is collected into the ink tank through the manifold 12 and the discharge pipe 14.

Figure 3:
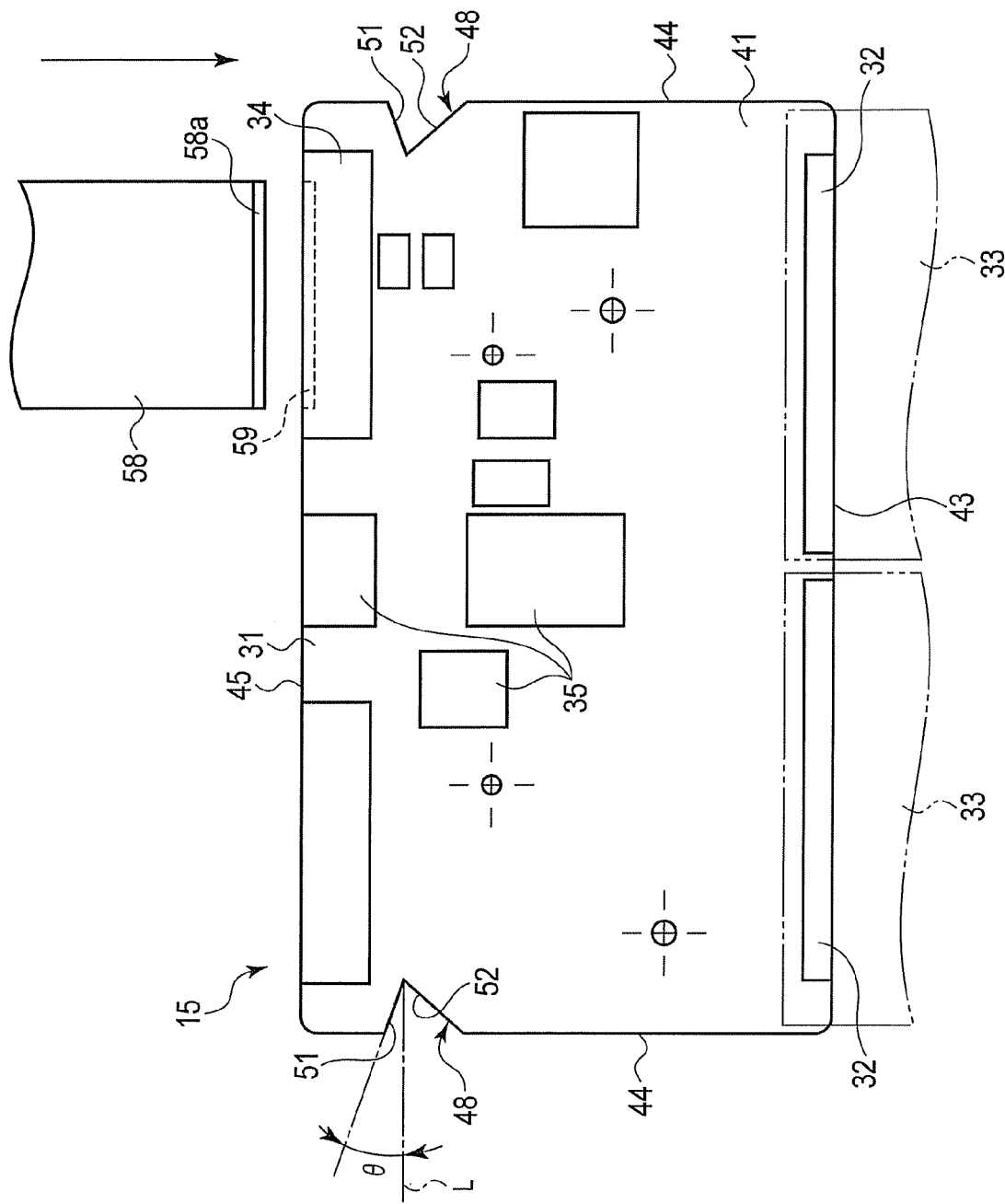
FIG. 3 is a plan view of a circuit board according to the embodiment.

FIG. 3 is a plan view of a circuit board 15. In the following explanation, one circuit board 15 of the circuit boards 15 is described as a representative. The other circuit board 15 has the same structure as that of one circuit board 15.

As illustrated in FIG. 3, the circuit board 15 includes a board main body 31, a plurality of electrodes 32, a pair of film carrier packages (FCPs) 33, a connector 34, and a plurality of mounted parts 35. In FIG. 3, the FCPs 33 are denoted by two-dot chain lines. The FCPs 33 are an example of a circuit plate. The FCPs 33 are also referred to as tape carrier packages (TCPs).

The board main body 31 is a printed circuit board which is formed in a generally rectangular plate shape and has stiffness. As illustrated in FIG. 1 to FIG. 3, the board main body 31 includes a first surface 41, a second surface 42, a first side edge 43, a pair of second side edges 44, and a third side edge 45.

As illustrated in FIG. 1, the second surface 42 faces the manifold 12, the supply pipe 13, and the discharge pipe 14. The first surface 41 is located opposite to the second surface 42, and faces the outside of the inkjet head 1. The embodiment is not limited to this structure, but the first surface 41 may face the manifold 12, and the second surface 42 may face the outside of the inkjet head 1.

The first side edge 43 extends between first surface 41 and the second surface 42. The first side edge 43 is closer to the head main body 11 than the second side edges 44 are, and closer to the head main body 11 than the third side edge 45 is.

Each of the second side edges 44 extends between the first surface 41 and the second surface 42. As illustrated in FIG. 3, one second side edge 44 intersects one end part of the first side edge 43 at right angles. The other second side edge 44 intersects the other end part of the first side edge 43 at right angles.

The third side edge 45 extends between the first surface 41 and the second surface 42. The third side edge 45 is located opposite to the first side edge 43, and extends from one second side edge 44 to the other second side edge 44.

Each of the second side edges 44 is provided with a fitting part 48. The fitting part 48 is a notch which is formed in a generally triangular shape and enters the inside of the board main body 31. Each fitting part 48 is formed of a first edge part 51 and a second edge part 52, which are formed in the board main body 31.

An angle $\theta$ between the first edge part 51 and a line L which is parallel to the first side edge 43 is, for example, 15°. In other words, the first edge part 51 intersects each second side edge 44 at an angle of 105°. The angle between the first edge part 51 and the first side edge 43 is not limited to the above angle, but may be another angle which falls within a range of $0° \leq \theta < 90°$. The second edge part 52 intersects the first edge part 51 and the second side edge 44. The second edge part 52 is closer to the first side edge 43 than the first edge part 51 is. Specifically, the fitting part 48 is formed of the second edge part 52 which is close to the first side edge 43, and the first edge part 51 which is close to the third side edge 45.

The electrodes 32 are provided on the first surface 41. The electrodes 32 are arranged in a line along the first side edge 43. FIG. 3 illustrates the arranged electrodes 32 in a belt shape.

As illustrated in FIG. 1, each FCP 33 includes a resin film 55 in which a plurality of conductive traces are formed and which has flexibility, and an IC 56 which is connected to the conductive traces. The film 55 is a tape automated bonding (TAB). The IC 56 is a part to apply voltage to the electrodes of the piezoelectric element. The IC 56 is fixed to the film 55 by resin.

Each FCP 33 extends between the head main body 11 and the board main body 31. Specifically, one end part of each FCP 33 is connected by thermo-compressive bonding to the electrical traces of the base plate 21 by an anisotropic conductive film (ACF). Thereby, the conductive traces of the FCP 33 are electrically connected to the electrical traces.

Since each FCP 33 is connected to the electrical traces of the base plate 21, each IC 56 is electrically connected to the electrodes of the piezoelectric element through the conductive traces of the FCP 33. Each IC 56 applies voltage to the electrodes through the conductive traces of the film 55.

The other end part of each FCP 33 is soldered to the electrodes 32 provided on the board main body 31. Thereby, the conductive traces of each FCP 33 are electrically connected to the electrodes 32. In addition, each FCP 33 is adhered to the board main body 31 only by soldering.

As illustrated in FIG. 3, the connector 34 is attached to the first surface 41 of the board main body 31. The connector 34 may be attached to the second surface 42. The connector 34 is disposed along the third side edge 45. The connector 34 is provided with an insertion port 59, into which a terminal part 58a of the cable 58 is inserted. The insertion port 59 is opened in a direction perpendicular to the first side edge 43.

The cable 58 is, for example, a flexible printed circuit board (FPC). The terminal part 58a of the cable 58 is inserted into the insertion port 59 of the connector 34 in a direction perpendicular to the first side edge 43, as illustrated by an arrow in FIG. 3. The cable 58 is connected to a controller which controls the inkjet head 1. The controller inputs a drive signal to the IC 56 through the cable 58.

The mounted parts 35 are mounted on the first surface 41 of the board main body 31. The mounted parts 35 are various parts such as a capacitor and a chip. The mounted parts 35 may be mounted on the second surface 42.

Figure 5:
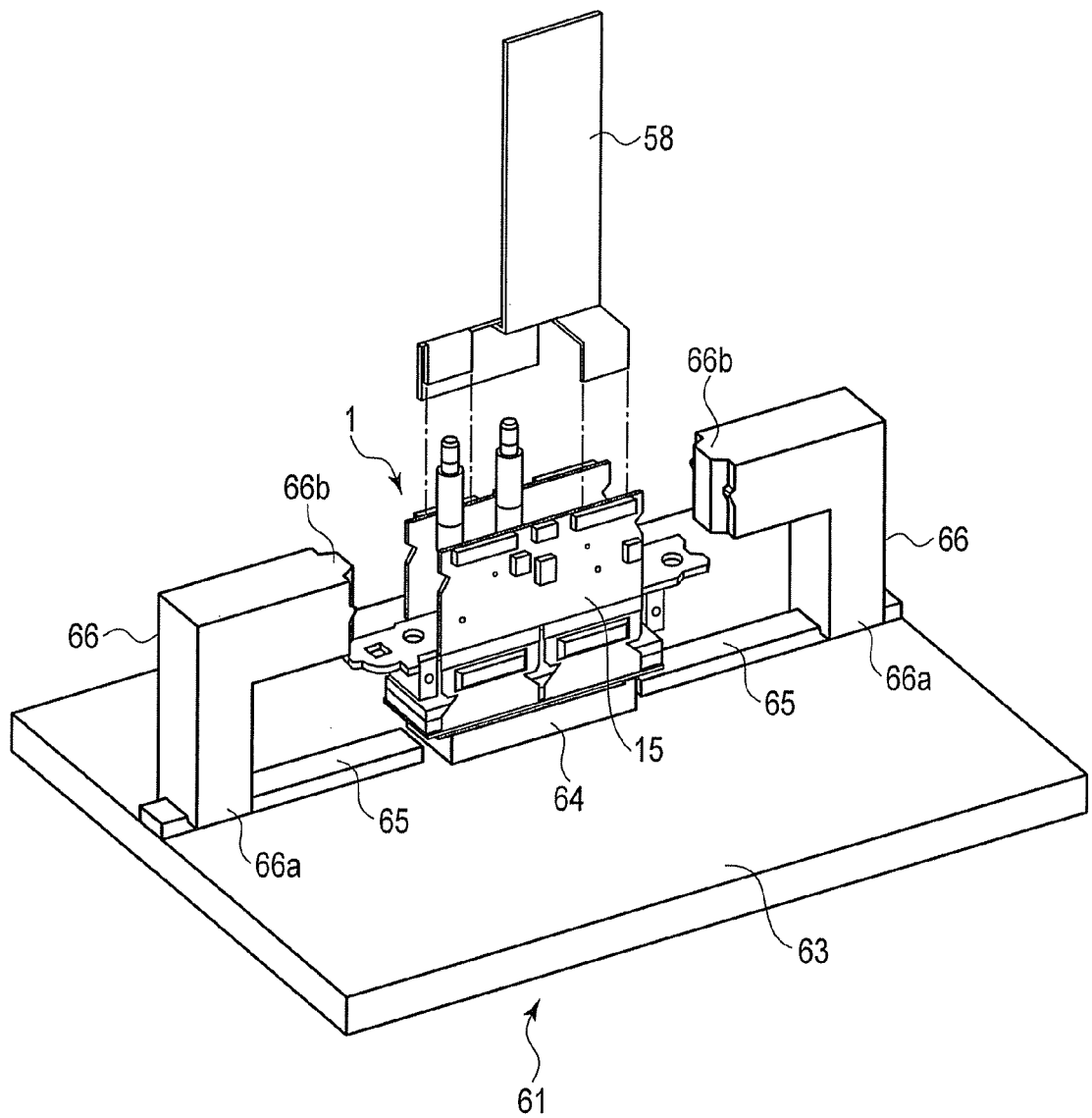
FIG. 5 is a perspective view of the assembling jig in which the inkjet head of the embodiment is mounted.

FIG. 4 is a perspective view of an assembling jig 61 to insert the terminal part 58a of the cable 58 into the insertion port 59 of the connector 34. FIG. 5 is a perspective view of the assembling jig 61 in which the inkjet head 1 is mounted.

As illustrated in FIG. 4, the assembling jig 61 includes a base 63, a receiver 64, a pair of guides 65, and a pair of holding tools 66.

The base 63 is formed in a rectangular plate shape. The receiver 64 is attached to a center part of the base 63. The receiver 64 is a part which is formed in a rectangular shape, and on which the head main body 11 of the inkjet head 1 is mounted. The receiver 64 supports the head main body 11 such that the inkjet head 1 becomes stable.

The guides 65 are attached to the base 63, with the receiver 64 interposed therebetween. Each of the holding tools 66 has a generally L shape. One end part 66a of each holding tool 66 is attached to the corresponding guide 65. Each holding tool 66 is movable along the guide 65 as illustrated by arrows in FIG. 4, by driving means such as a motor.

Figure 6:
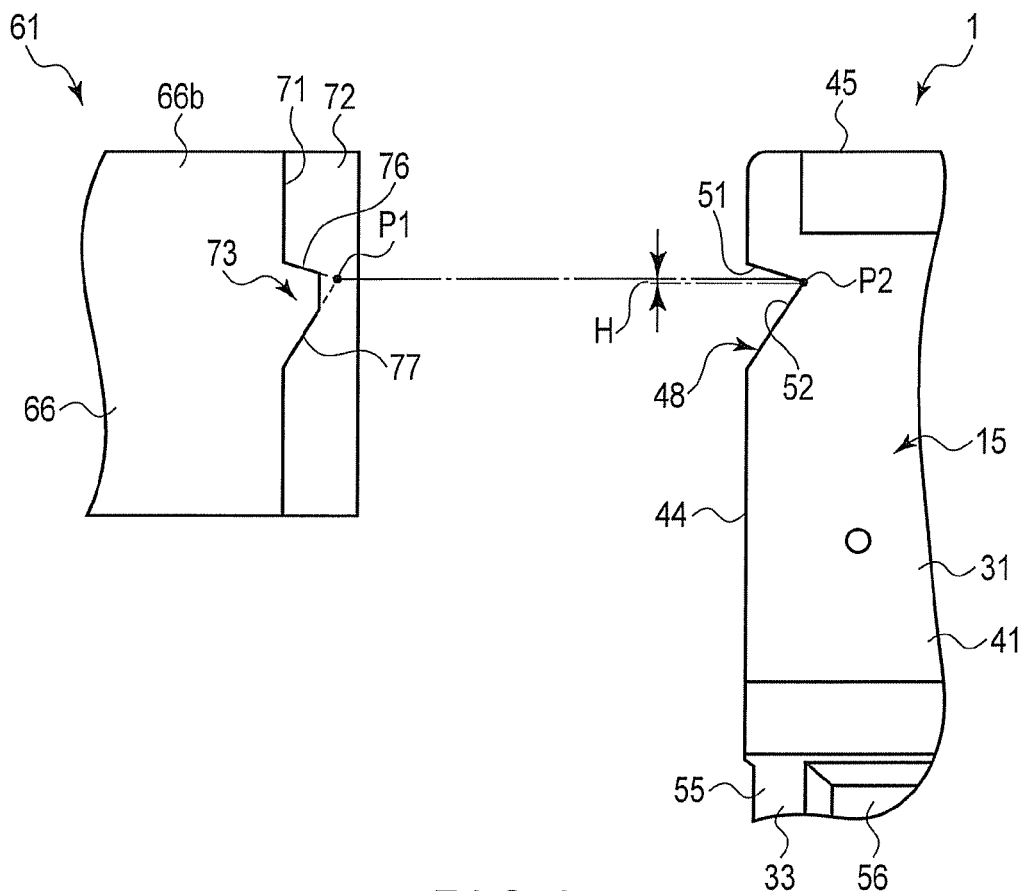
FIG. 6 is a front view of a holding tool and the circuit board of the embodiment.
Figure 7:
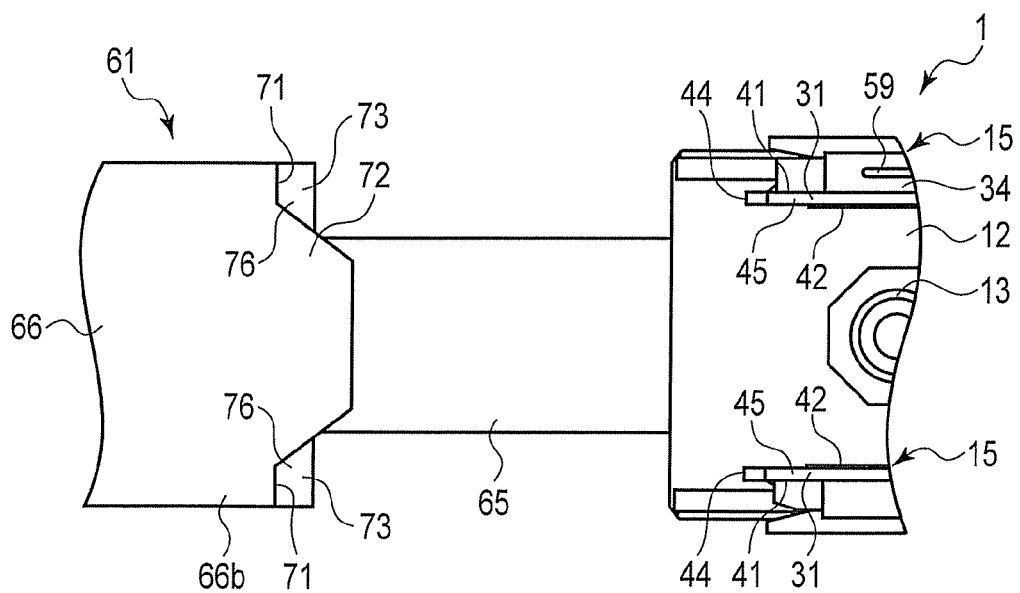
FIG. 7 is a top view of the holding tool and the circuit board of the embodiment.

FIG. 6 is a front view of a holding tool 66 and a circuit board 15. FIG. 7 is a top view of the holding tool 66 and the circuit board 15. As illustrated in FIG. 6 and FIG. 7, the other end part 66b of each holding tool 66 is provided with a pair of abutting surfaces 71, a tapered part 72, and a pair of fixing parts 73.

The abutting surfaces 71 are formed to be parallel to the second side edges 44 of the board main bodies 31, when the head main body 11 is mounted on the receiver 64. The abutting surfaces 71 abut against the second side edges 44 as a result of moving the holding tool 66.

As illustrated in FIG. 7, the tapered part 72 projects from the abutting surfaces 71. The tapered part 72 is located between the board main bodies 31 when the abutting surfaces 71 abut against the second side edges 44. The tapered part 72 is tapered to easily enter a space between the board main bodies 31.

As illustrated in FIG. 6, the fixing parts 73 project from the abutting surfaces 71. The fixing parts 73 are projecting parts which correspond to the fitting parts 48. Each fixing part 73 has a trapezoidal shape. Specifically, each fixing part 73 has a triangular shape, a top of which is cut away, and has an upper edge 76 and a lower edge 77. The angle of inclination of the upper edge 76 is the same as the angle of inclination of the first edge part 51 of each fitting part 48. The angle of inclination of the lower edge 77 is the same as the angle of inclination of the second edge part 52 of each fitting part 48.

An imaginary vertex P1 of the fixing part 73 is located in a position which is higher by a distance H than a vertex P2 of the fitting part 48, when the head main body 11 is mounted on the receiver 64. The imaginary vertex P1 of the fixing part 73 is an intersection point of the upper edge 76 and the lower edge 77. Specifically, the fitting part 48 is shifted from the corresponding fixing part 73 by distance H toward the first side edge 43. In other words, the vertex P2 of the fitting part 48 is closer to the first side edge 43 than the imaginary vertex P1 of the fixing part 73 is.

The following is explanation of an example of a method of manufacturing the inkjet head 1 having the above structure. First, one end part of each FCP 33, to which the ACF is adhered, is connected and fixed to the electrical traces of the base plate 21 by thermo-compressive bonding. Next, the other end parts of two pairs of FCPs 33 are soldered to electrodes 32 provided on a pair of board main bodies 31. Thereby, the FCPs 33 are interposed between the board main bodies 33 and the head main body 11.

Next, the head main body 11, to which the FCPs 33 are fixed, is placed on the receiver 64 of the assembling jig 61. In this state, the board main bodies 31 are supported by two pairs of FCPs 33 and stand in a generally vertical direction.

Figure 8:
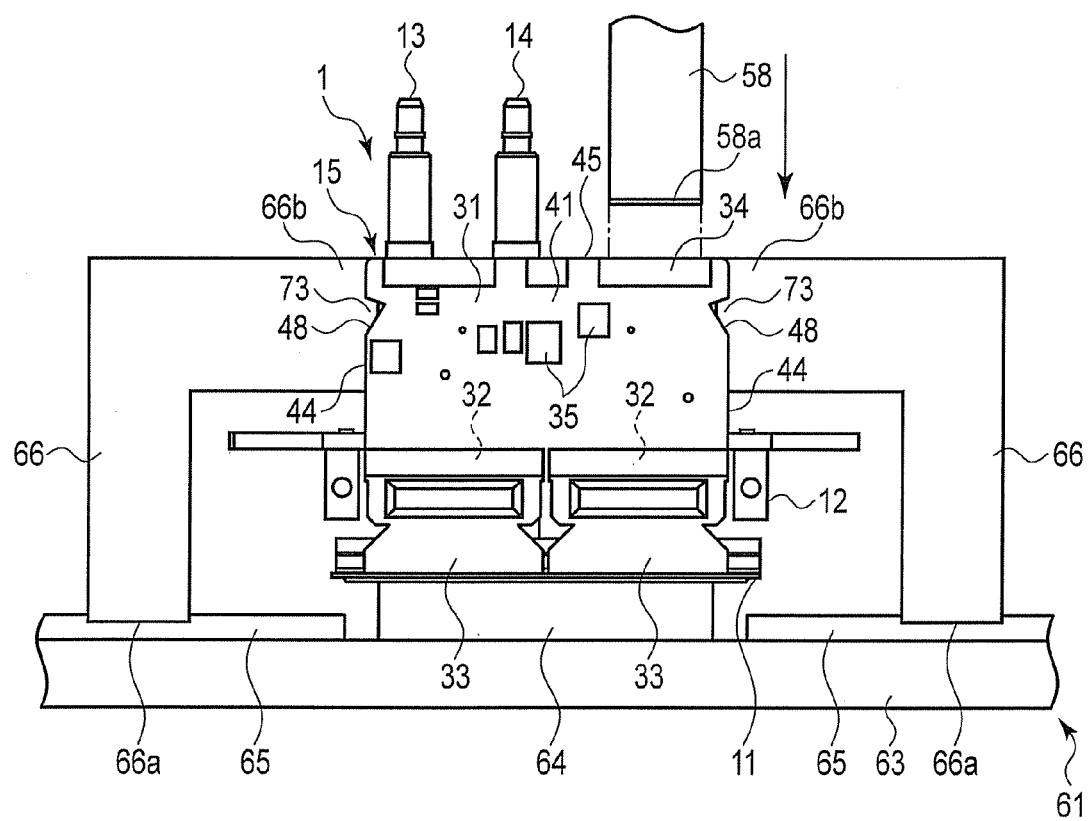
FIG. 8 is a front view of the inkjet head which is fixed by the assembling jig according to the embodiment.
Figure 9:
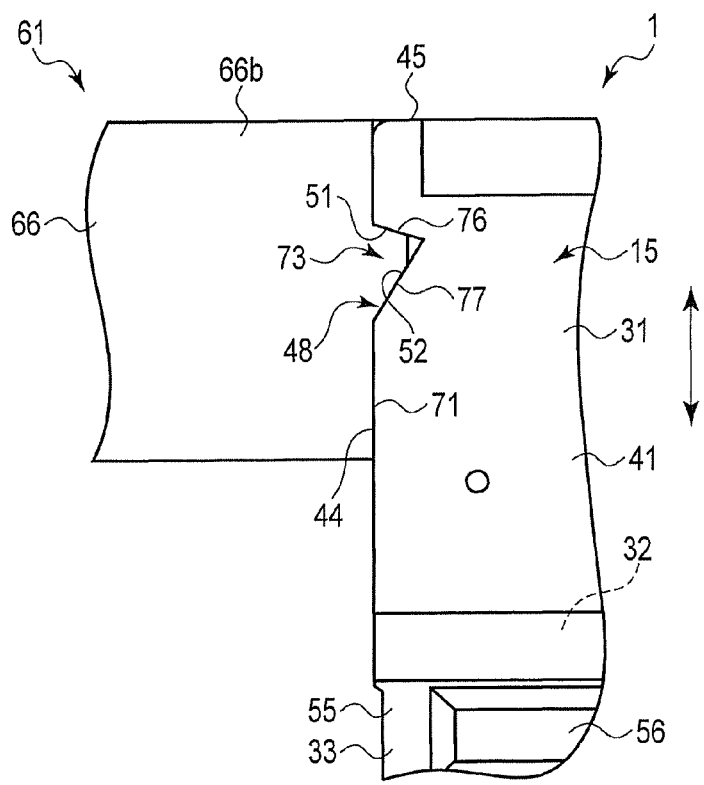
FIG. 9 is a front view of the circuit board which is fixed by the holding tool according to the embodiment.
Figure 10:
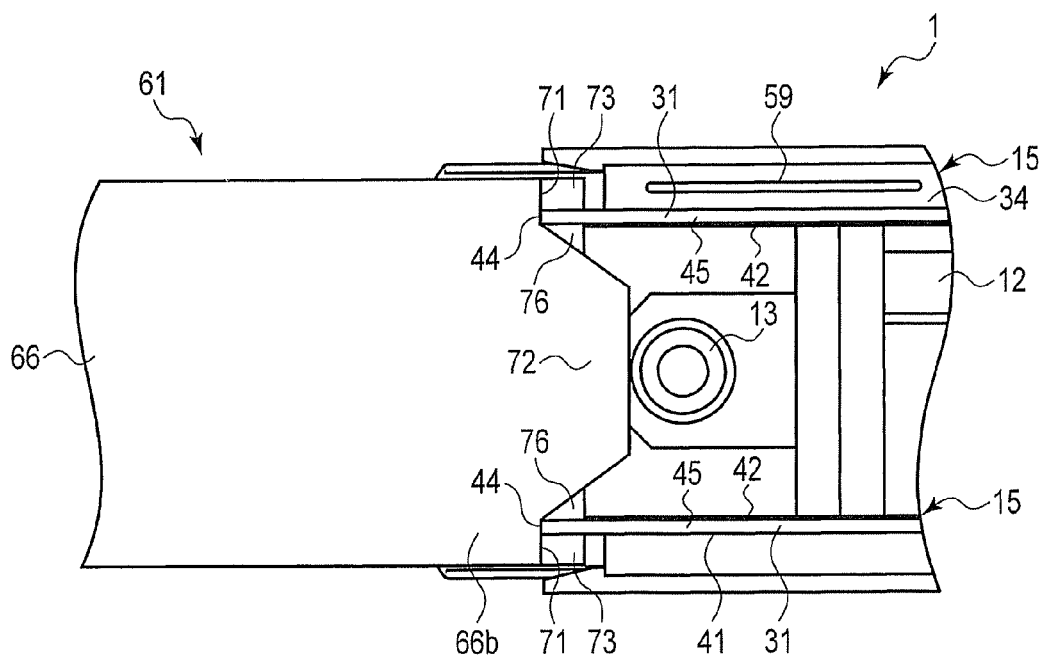
FIG. 10 is a top view of the circuit board which is fixed by the holding tool according to the embodiment.

FIG. 8 is a front view of the inkjet head 1 which is fixed by the assembling jig 61. FIG. 9 is a front view of the circuit board 15 which is fixed by the holding tool 66. FIG. 10 is a top view of the circuit board 15 which is fixed by the holding tool 66.

In a state where the head main body 11 is placed on the receiver 64, the holding tools 66 are moved by the driving means. The holding tools 66 are moved until the abutting surfaces 71 thereof abut against the second side edges 44 of the board main bodies 31. The fixing parts 73 are fitted with the corresponding fitting parts 48, in a direction which is perpendicular to the direction in which the terminal part 58a of the cable 58 is inserted into the connector 34.

Each fitting part 48 is shifted from the corresponding fixing part 73 by distance H toward the first side edge 43. Therefore, when the fixing parts 73 are inserted into the respective fitting parts 48, the board main bodies 31 are lifted up by distance H by the fixing parts 73.

By fitting the fixing parts 73 with the respective fitting parts 48, the board main bodies 31 are fixed in a direction which is perpendicular to the first side edge 43, illustrated by an arrow in FIG. 9. Specifically, the fixing parts 73 restrict movement of the board main bodies 31 in the direction perpendicular to the first side edge 43.

As illustrated in FIG. 8, by fitting the fixing parts 73 with the fitting parts 48, the board main bodies 31 are held between the holding tools 66. In this state, the terminal part 58a of the cable 58 is inserted into the insertion port 59 of the connector 34. The terminal part 58a is inserted into the insertion port 59 in the direction perpendicular to the first side edge 43. Next, the inkjet head 1 is detached from the assembling jig 61, and thereby the manufacturing process of the inkjet head 1 is completed.

According to the inkjet head 1 of the above structure, the fitting parts 48 are provided on the second side edges 44 of the board main bodies 31. Thereby, the board main bodies 31 are fixed by using a jig such as the assembling jig 61. This structure suppresses the load which is applied to a connecting part between the electrodes 32 and a circuit plate such as the FOP 33 when the board main bodies 31 and parts such as the cable 58 are assembled. Therefore, it is possible to suppress damage to the circuit boards 15 during assembly.

More specifically, the terminal part 58a of the cable 58 is inserted into the insertion port 59 of the connector 34 in the direction perpendicular to the first side edge 43. On the other hand, the fitting parts 48 provided on the second side edges 44 are fitted with the fixing parts 73 of the assembling jig 61. Thereby, the board main bodies 31 are fixed in the direction perpendicular to the first side edge 43. Therefore, even when the board main bodies 31 receive external force caused by inserting the terminal part 58a into the connector 34, the board main bodies 31 are not pushed down but held in the fixed position.

Since the board main bodies 31 are held, the FCPs 33 soldered to the electrodes 32 are kept in the fixed position, and prevented from bearing load. This structure suppresses damage to connecting parts between the electrodes 32 and the FCPs 33 due to external force during assembly.

The imaginary vertex P1 of each fixing part 73 is disposed in a position higher than the vertex P2 of each fitting part 48, when the head main body 11 is mounted on the receiver 64. When the fixing parts 73 are inserted into the respective fitting parts 48, the board main bodies 31 are lifted up by the fixing parts 73. This structure prevents load on connecting parts between the electrodes 32 and the FCPs 33, which is caused by pushing down the board main bodies 31.

An angle between the first edge part 51 and the first side edge 43 is equal to or more than 0°, and less than 90°. Thereby, even when the angle of inclination of the first edge parts 51 of the fitting parts 48 fluctuates and the angle of inclination of the upper edges 76 of the fixing parts 73 fluctuates in manufacturing, the fixing parts 73 are fitted with the fitting parts 48.

Each fixing part 73 is formed in a triangular shape, a top of which is cut away. Thereby, even when the angle of inclination of the first edge parts 51 of the fitting parts 48 fluctuates and the angle of inclination of the upper edges 76 of the fixing parts 73 fluctuates in manufacturing, the fixing parts 73 are fitted with the fitting parts 48.

Figure 11:
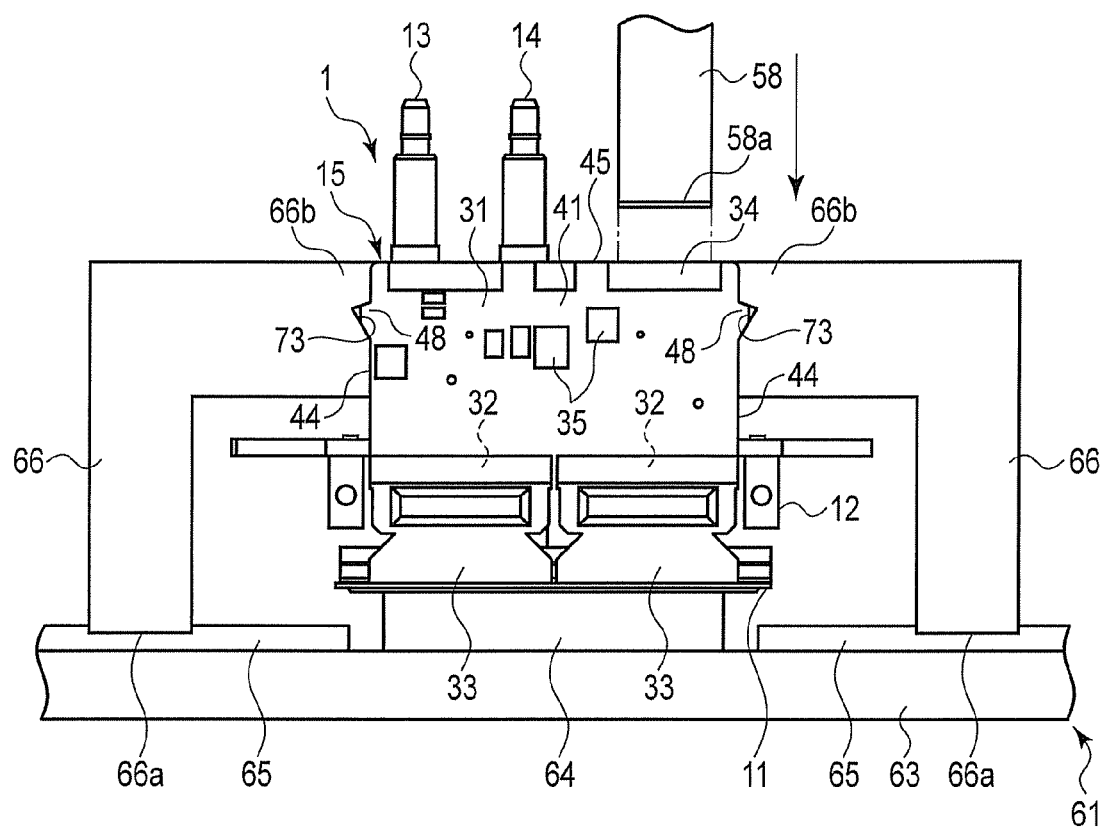
FIG. 11 is a front view of a modification of the inkjet head and the assembling jig.

FIG. 11 is a front view of a modification of the inkjet head 1 and the assembling jig 61. As illustrated in FIG. 11, each fitting part 48 may be a projecting part which projects from the second side edge 44. Each fixing part 73 may be a notch which is provided in the abutting surface 71 to be fitted with the fitting part having the above shape.

In the above embodiment, one circuit board 15 is provided with a pair of fitting parts 48. The present invention is not limited to this structure, but one circuit board 15 may be provided with only one fitting part 48. In addition, although the FCPs 33 are shown as an example of a circuit plate, the circuit plate may be another circuit plate such as a flexible printed circuit board.

According to the circuit boards of at least one embodiment described above, a connector, into which a cable is inserted in the direction perpendicular to the first side edge, is attached to one of the first surface and the second surface, and the fitting parts are provided on the second side edges which intersect the first side edge. Thereby, damage to the circuit boards during assembly is suppressed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An inkjet head comprising:
a head main body including a base plate, a nozzle plate, and an ink chamber which is supplied with ink;
a supply pipe through which the ink is supplied to the ink chamber;
a film carrier package connected to the head main body;
a board main body connected to the film carrier package, the board main body including a first surface, a second surface located opposite to the first surface, a first side edge that extends between the first surface and the second surface, and a pair of second side edges that extend between the first surface and the second surface and intersect the first side edge, each of the second side edges being provided with a fitting part; and
a connector which is attached to the board main body, and into which a cable is inserted in a direction perpendicular to the first side edge,
wherein the fitting part is a portion dented toward inside of the board main body so as to be engaged with one of two holding parts that move and approach the board main body in a direction intersecting the second side edges, and wherein the fitting part is formed of a first edge part which intersects the second side edge, and a second edge part which is located closer to the first side edge than the first edge part and is intersects the first edge part.

2. The inkjet head of claim 1, wherein an angle between the first edge part and the first side edge is greater than 0 but less than 90 degrees.

3. The inkjet head of claim 1, wherein the fitting part is a triangular notch having the first edge part and the second edge part as two sides of the notch.

4. The inkjet head of claim 1, wherein the second edge part intersects the second side edge.

* * * * *